(12) United States Patent
Okada et al.

(10) Patent No.: US 8,178,868 B2
(45) Date of Patent: May 15, 2012

(54) THIN-FILM LAMINATE AND ORGANIC TRANSISTOR USING THE SAME

(75) Inventors: Hiroyuki Okada, Nishinagae (JP); Shigeki Naka, Fuchu (JP)

(73) Assignee: National University Corporation University of Toyama (JP)

( * ) Notice: Subject to any disclaimer, the term of this patent is extended or adjusted under 35 U.S.C. 154(b) by 161 days.

(21) Appl. No.: 12/565,010

(22) Filed: Sep. 23, 2009

(65) Prior Publication Data

US 2010/0025672 A1 Feb. 4, 2010

Related U.S. Application Data

(63) Continuation of application No. PCT/JP2008/052394, filed on Feb. 14, 2008.

(30) Foreign Application Priority Data

Mar. 26, 2007 (JP) .................................. 2007-080314

(51) Int. Cl.
*H01L 29/08* (2006.01)
(52) U.S. Cl. ........................................... 257/40; 438/99
(58) Field of Classification Search ................ 257/40; 438/99
See application file for complete search history.

(56) References Cited

U.S. PATENT DOCUMENTS

| | | | | |
|---|---|---|---|---|
| 7,002,176 B2 * | 2/2006 | Iechi et al. | ........................ | 257/40 |
| 2007/0187674 A1 * | 8/2007 | Nakamura et al. | ............... | 257/40 |

FOREIGN PATENT DOCUMENTS

| | | |
|---|---|---|
| JP | 06-218870 | 8/1994 |
| JP | 2000-150168 | 5/2000 |
| JP | 2004-006476 | 1/2004 |
| JP | 2005-085945 | 3/2005 |

OTHER PUBLICATIONS

Yang et al .,"Pentacene-Based Planar- and Vertical-Type Organic Thin-Film Transistor",EEE transactions on electron devices, vol. 54, No. 7, Jul. 2007, pp. 1633-1636 has been attached.*
Ou et al.,"All Organic Hot-Carrier Triodes with Thin film Metal Base",Applied physics letters 89, 183508 (2006), pp. 183508-1-(183508-3) has been attached.*
Y.-Y. Lin, D. J. Gundlach, S. F. Nelson and T. N. Jackson: "Pentacene-Based Organic Thin-film Transistors", IEEE Trans.Electron Devices, 44(8), 1325 (1997).

* cited by examiner

*Primary Examiner* — Wai Sing Louie
*Assistant Examiner* — Bilkis Jahan
(74) *Attorney, Agent, or Firm* — Harness, Dickey & Pierce, P.L.C.

(57) ABSTRACT

An organic transistor includes a semiconductor section that includes a thin-film laminate in which a first organic thin film and a second organic thin film are alternately stacked. The thin-film laminate includes at least two layers of the first organic thin film. The first organic thin film is a pentacene thin film, and the second organic thin film is an amorphous organic thin film. The pentacene thin film may be a pentacene bilayer thin film, and the amorphous organic thin film may be a tetraaryldiamine thin film. The tetraaryldiamine thin film may be an α-NPD thin film. The organic transistor has improved transistor characteristics (e.g., mobility, ON/OFF ratio, or threshold value control).

3 Claims, 11 Drawing Sheets

[Pentacene (2ML) / $Al_2O_3$ (10 Å)]×13
/ Pentacene (2ML)
Roughness 19.6 nm

[Pentacene (2ML) / SiOx (5 Å)]×13
/ Pentacene (2ML)
Roughness 15.8 nm

[Pentacene (100 Å) / Al$_2$O$_3$ (10 Å)] × 3
/ Pentacene (100 Å)
Roughness 3.9 nm Pentacene (400 Å)
Roughness 6.7 nm

MOLECULAR STRUCTURE OF α-NPD

- CHANNEL LENGTH L=0.5mm, CHANNEL WIDTH W=2mm
- MOBILITY 1.0cm$^2$/Vs   · ON/OFF RATIO 542
- THRESHOLD VALUE -3.0V, S=5.26V /decade <PENTACENE (COMPARATIVE EXAMPLE)>

- CHANNEL LENGTH L=1mm, CHANNEL WIDTH W=2mm
- MOBILITY 1.35cm$^2$/Vs   · ON/OFF RATIO 4.6×10$^4$
- THRESHOLD VALUE -14.5V, S=0.88V/decade <DEVICE 2>

- CHANNEL LENGTH L=0.5mm, CHANNEL WIDTH W=2mm
- MOBILITY 1.25cm$^2$/Vs    • ON/OFF RATIO 1.0×10$^6$
- THRESHOLD VALUE -10.0V, S=0.7V /decade <DEVICE 3>

⎡ •CHANNEL LENGTH L=0.5mm, CHANNEL WIDTH W=2mm ⎤
| •MOBILITY 0.8cm² /Vs  •ON/OFF RATIO 3×10³ |
⎣ •THRESHOLD VALUE -6.0V, S=0.68V /decade ⎦

<DEVICE 4>

[· CHANNEL LENGTH L=0.5mm, CHANNEL WIDTH W=2mm
· MOBILITY 0.8cm² /Vs     · ON/OFF RATIO 7.1×10³
· THRESHOLD VALUE -2.5V, S=0.62V /decade]

<DEVICE 5>

| DEVICE | COMPARATIVE EXAMPLE | SUPERLATTICE | | | | |
|---|---|---|---|---|---|---|
| | PENTACENE | 1 | 2 | 3 | 4 | 5 |
| $\mu$ (cm2/Vs) | 1.0 | - | 1.35 | 1.25 | 0.8 | 0.8 |
| S (V/decade) | 5.26 | - | 0.88 | 0.7 | 0.68 | 0.62 |
| VT (V) | -3.0 | - | -14.5 | -10 | -6 | -2.5 |
| ON/OFF RATIO | 542 | - | 4.60E+04 | 1.00E+06 | 3.00E+05 | 7.10E+03 |
| ON-RESISTANCE($\Omega$) | 9.72E+05 | - | 1.35E+06 | 5.56E+05 | 4.35E+06 | 6.14E+05 |

THIN-FILM LAMINATE AND ORGANIC TRANSISTOR USING THE SAME

CROSS REFERENCE TO RELATED APPLICATION

This application is a continuation of International Patent Application No. PCT/JP2008/052394, having an international filing date of Feb. 14, 2008, which designated the United States, the entirety of which is incorporated herein by reference. Japanese Patent Application No. 2007-080314 filed on Mar. 26, 2007 is also incorporated herein by reference in its entirety.

BACKGROUND

The present invention relates to a thin-film laminate that may be applied to organic electronic devices such as organic electroluminescence (EL) elements, organic photoelectric conversion elements, and organic transistors, an organic transistor using the same, and the like.

Organic electronic technology that enables an increase in area and a reduction in thickness and weight and ensures flexibility when using a flexible substrate, has attracted attention.

An organic transistor is used as a switching device. A low-molecular-weight organic material such as pentacene has been studied.

It has not been reported that a transistor using a low-molecular-weight organic material exhibits a high mobility of about 1 $cm^2/Vs$ in an amorphous state. Moreover, since a single crystal cannot be formed, an increase in mobility has been attempted by controlling a polycrystalline state.

A study on a pentacene transistor conducted by the Pennsylvania university since 1997 achieved a remarkable progress with regard to an increase in mobility (Y.-Y. Lin, D. J. Gundlach, S. F. Nelson and T. N. Jackson: IEEE Trans. Electron Devices, 44 (8), 1325 (1997)).

For example, a mobility 1.5 $cm^2/Vs$, an ON/OFF ratio of $10^8$, and a sub-threshold slope of 0.5 V/decade have been reported.

Pentacene is a polyacene compound that has a pi-conjugated molecular structure. Pentacene exhibits a high mobility due to pi electrons, and shows semiconductor properties.

However, it is difficult to crystallize pentacene due to its planar molecular structure. When forming a film having a thickness of several hundreds of angstroms, dendritic pentacene is generally grown over several micrometers to produce a structure in which the molecules are finely stepped. Therefore, it is difficult to obtain a film having a stable superlattice structure.

When forming a thick film using a pentacene organic semiconductor or the like, the initial two-dimensional growth changes into three-dimensional growth so that it is difficult to form a continuous semiconductor layer on the upper side.

An object of several aspects of the invention is to provide a thin-film laminate that allows a film structure that generally becomes a dendritic structure or the like by known semiconductor layer deposition and does not exhibit uniformity to form a flat film by forming a stacked structure of a first organic layer that is controlled at a molecular layer thickness level and a second organic layer differing from the first organic layer or an ultrathin inorganic insulating layer.

SUMMARY

According to one aspect of the invention, there is provided a thin-film laminate comprising a first organic thin film having semiconductor properties and a second organic thin film or an inorganic insulating thin film that are alternately stacked.

The first organic thin film and the second organic thin film are formed of different organic materials.

In one aspect of the invention, the first organic thin film is formed of an acene-based aromatic such as tetracene, pentacene, or hexacene.

The acene-based aromatic is preferably pentacene.

In the first organic thin film, it is preferable that the molecular films are formed in layers. For example, pentacene preferably has a bilayer structure.

When forming a thick film having a thickness of several hundreds of angstroms using only pentacene, the pentacene molecules are grown to have a three-dimensional dendritic structure. The invention suppresses formation of a three-dimensional structure by limiting the thickness of pentacene to about 100 Å or less.

Formation of a three-dimensional structure of the first organic thin film formed of the acene-based aromatic such as pentacene may be suppressed by interposing the second organic thin film formed of an organic material differing from that of the first organic thin film between the first organic thin films, or stacking the first organic thin film and the inorganic insulating thin film.

This produces a highly uniform superlattice structure.

Ideally, a pentacene bilayer and the inorganic insulating thin film are stacked.

As the inorganic insulating thin film, a metal oxide thin film is preferable.

Examples of the metal oxide include oxides of Si, Al, In, Sn, Zn, Ti, Cu, Ce, Ta, and the like. Among these, $Al_2O_3$ and $SiO_x$ are preferable.

$SiO_x$ is not limited to $SiO_2$, but generally refers to a silicon oxide-based thin film.

The first organic thin film and the inorganic insulating thin film may be stacked to obtain a highly uniform superlattice structure. The inventors of the invention produced an organic transistor according to another aspect of the invention using a pentacene/inorganic insulating thin film laminate as the semiconductor section of the organic transistor. As a result, the inventors found that the inorganic insulating thin film has a high resistance for the organic transistor.

Therefore, the inventors produced an organic transistor using a laminate of the first organic thin film and the second semiconductor organic thin film differing from the first organic thin film as the semiconductor section of the organic transistor. As a result, the transistor characteristics were improved.

The second organic thin film is used to suppress formation of a three-dimensional structure of the first organic thin film to obtain a highly uniform superlattice structure.

The inventors deposited a pentacene bilayer on a polyimide insulating film having a surface roughness 0.26 nm. The surface roughness of the resulting product was 0.27 nm (i.e., very flat).

The roughness obtained using a pentacene trilayer was almost equal to that when using a pentacene bilayer.

The inventors measured the thicknesses of a pentacene bilayer and a pentacene trilayer, and found that the thickness of a pentacene monolayer was 1.54 nm.

When applying one aspect of the invention to the semiconductor section of the organic transistor according to another aspect of the invention, it is preferable to use a flat second organic thin film in order to suppress formation of a three-dimensional structure of the first organic thin film to ensure flatness.

It suffices that the second organic thin film have a flatness equal to or less than the thickness of the molecular layer of the first organic thin film taking account of the semiconductor properties of the lattice structure.

For example, since the thickness of a pentacene monolayer is 1.54 nm, it is preferable that the second organic thin film have a flatness of 1.54 nm or less when using pentacene as the material for the first organic thin film.

It is preferable that the second organic thin film be an amorphous semiconductor. Examples of the material for the second organic thin film include tetraaryldiamines known as a hole-transporting material such as 4,4',4"-tris[N-(3-methylphenyl)-N-phenylamino]triphenylamine (m-MTDATA), N,N'-diphenyl-N,N"-bis(3-methylphenyl)-1,1'-biphenyl-4,4'-diamine (TPD), N,N'-di(1-naphthyl)-N,N'-diphenyl-1,1'-biphenyl-4,4'-diamine (NPD), and 1,1-bis(4-di-p-tolylaminophenyl)cyclohexane (BTAPCH).

The tetraaryldiamines (heat-resistant low-resistance transporting material) disclosed in JP-A-2000-150168 may also be used.

Among these, α-NPD (4,4-bis[phenyl(1-naphtyl)amino]-1,1'biphenyl) is preferable.

Therefore, an organic transistor that exhibits excellent transistor characteristics can be obtained using a thin-film laminate in which the first organic thin film and the second organic thin film are alternately stacked as the semiconductor section.

The first organic thin film is preferably a pentacene thin film (ideally a pentacene bilayer thin film), and the second organic thin film is preferably an α-NPD film.

FIG. 6 shows the molecular structure of α-NPD.

α-NPD shows amorphous characteristics upon deposition.

According to another aspect of the invention, there is provided a method of producing a thin-film laminate comprising alternately depositing an acene-based aromatic thin film and an inorganic insulating thin film on an insulating substrate in this order, and depositing the acene-based aromatic thin film on the outermost layer such as a polyimide insulating film.

When applying the invention to a device of a flexible display, the thin-film laminate is formed on a substrate (e.g., plastic substrate). Note that the substrate need not necessarily exhibit flexibility. The thin-film laminate may also be formed on various substrates such as a glass substrate.

The first organic thin film and the second organic thin film may be stacked by alternately depositing the thin films by a resistive heating method or the like using a vacuum deposition device.

Since an organic semiconductor has been formed using only one organic material, the resulting organic semiconductor has a dendritic structure to have a non-uniform superlattice film structure. According to one aspect of the invention, since the first organic thin film (superlattice) and the second organic thin film (amorphous) or the inorganic insulating thin film are stacked, it is possible to ensure two-dimensional growth of the first organic thin film so that an excellent organic semiconductor superlattice structure is obtained.

The surface roughness of the thin-film laminate can be reduced by controlling the thickness of the organic layer such as pentacene to a molecular layer thickness level (e.g., bilayer), and selecting alumina or the like as the material for the inorganic insulating thin film.

According to another aspect of the invention, since the thin-film laminate of the first organic thin film (acene-based aromatic thin film such as pentacene) and the amorphous second organic thin film is used as the semiconductor section of the organic transistor, an organic transistor that exhibits excellent transistor characteristic can be obtained.

DESCRIPTION OF EXEMPLARY EMBODIMENTS

A production example of the thin-film laminate according to one aspect of the present invention is described below.

The production example is described below taking an evaluation sample of Example 1 described later as an example. A polyimide insulating film ("CT4112" manufactured by KYOCERA Chemical Corporation) was applied to a cleaned glass substrate by spin coating, and baked at 190° C. for one hour in air.

The sample was then introduced into a vacuum deposition device. After adjusting the degree of vacuum to about $3 \times 10^{-6}$ Torr, pentacene (deposition rate: 0.3 Å/s) (resistive heating method) and $Al_2O_3$ (deposition rate: 0.1 Å/s) (electron-beam deposition method) were alternately stacked at a substrate temperature of 70° C. to obtain a [pentacene (bilayer)/$Al_2O_3$ (5 Å)]×13/pentacene (bilayer) structure.

In the examples, a pair of a pentacene layer and an inorganic layer was stacked 13 times in order to obtain a given total thickness. The number of layers may be determined corresponding to the application.

Example 1

Figure 1:
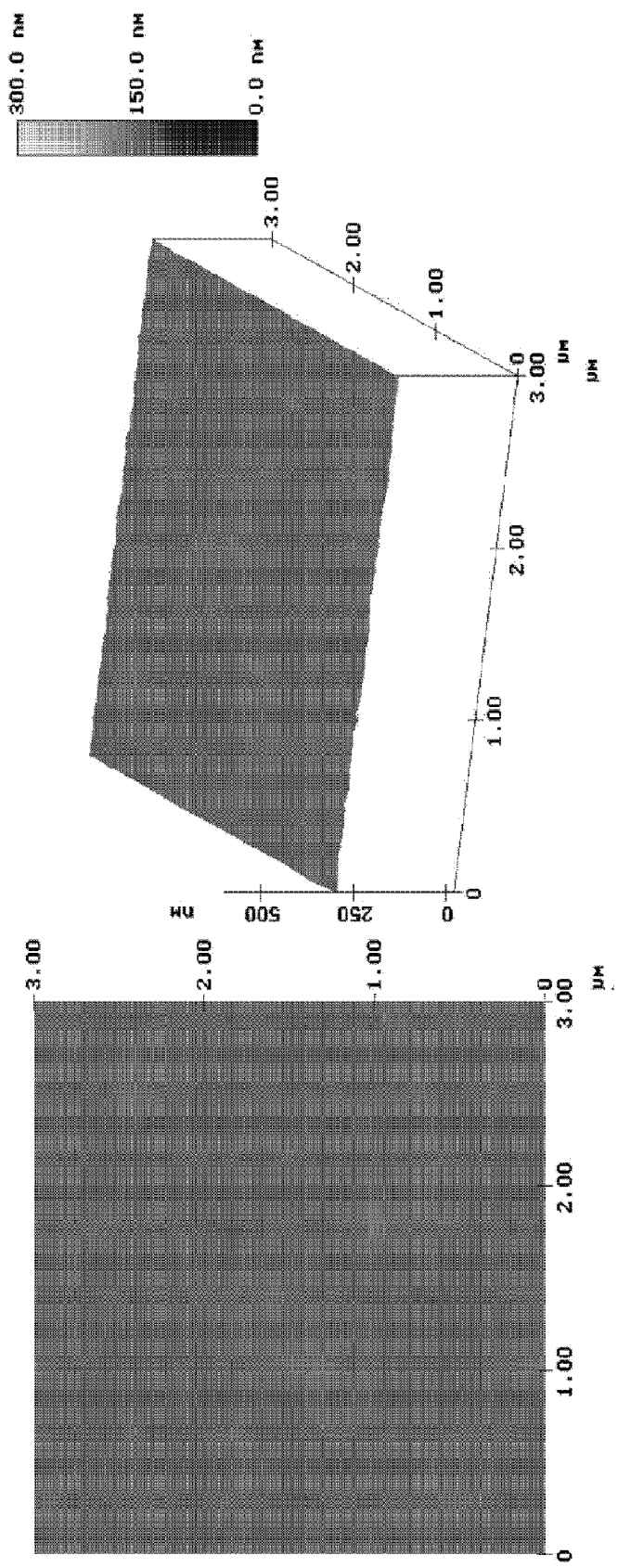
FIG. 1 shows a lamination example of a pentacene film and an $Al_2O_3$ film (5 Å).

A pentacene bilayer and an $Al_2O_3$ film (thickness: about 5 Å) were alternately deposited 13 times, and a pentacene bilayer was stacked on the laminate according to the above production method. FIG. 1 shows an AFM image (atomic force micrograph) of the thin-film laminate.

The surface roughness (MR) was very small (2 nm). A thin-film laminate with excellent flatness was obtained.

Example 2

Figure 2:
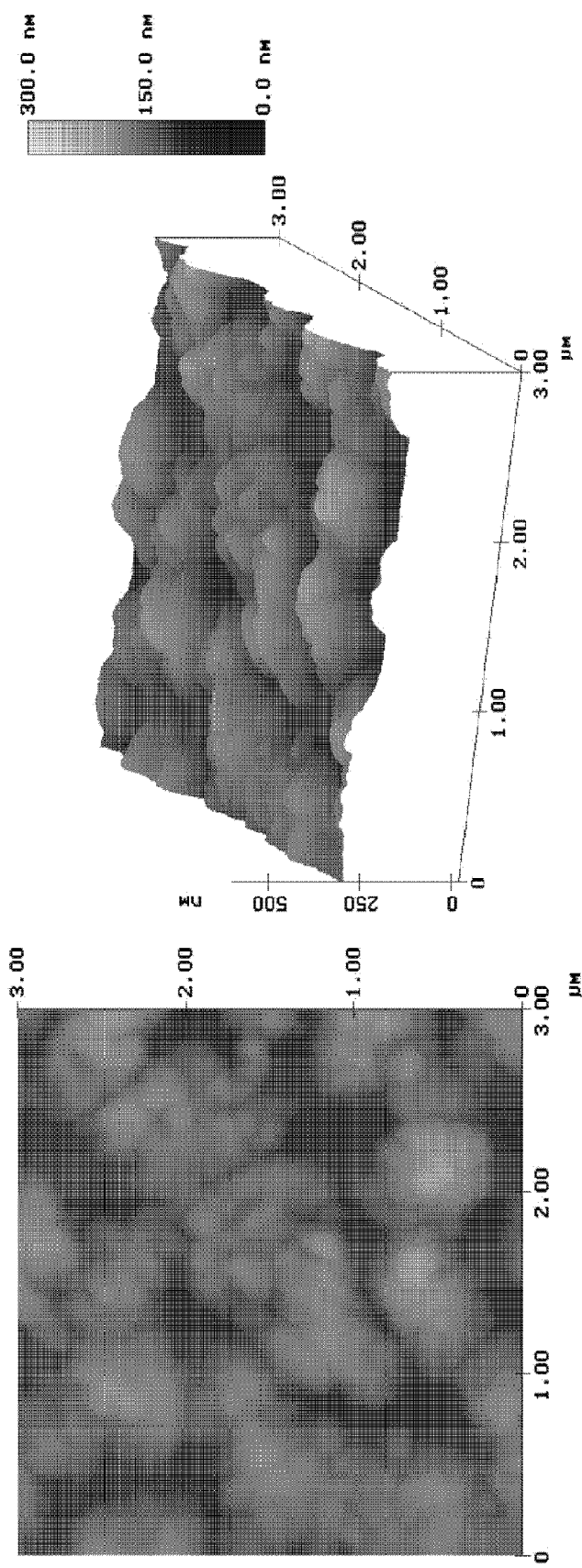
FIG. 2 shows a lamination example of a pentacene film and an $Al_2O_3$ film (10 Å).

A pentacene bilayer and an $Al_2O_3$ film (thickness: about 10 Å) were alternately deposited 13 times, and a pentacene bilayer was stacked on the laminate. FIG. 2 shows an AFM image of the thin-film laminate.

When the $Al_2O_3$ film had a thickness of 10 Å the surface roughness was 19.6 nm. Specifically, the effect of the thickness of the $Al_2O_3$ film on the surface roughness was observed.

Example 3

Figure 3:
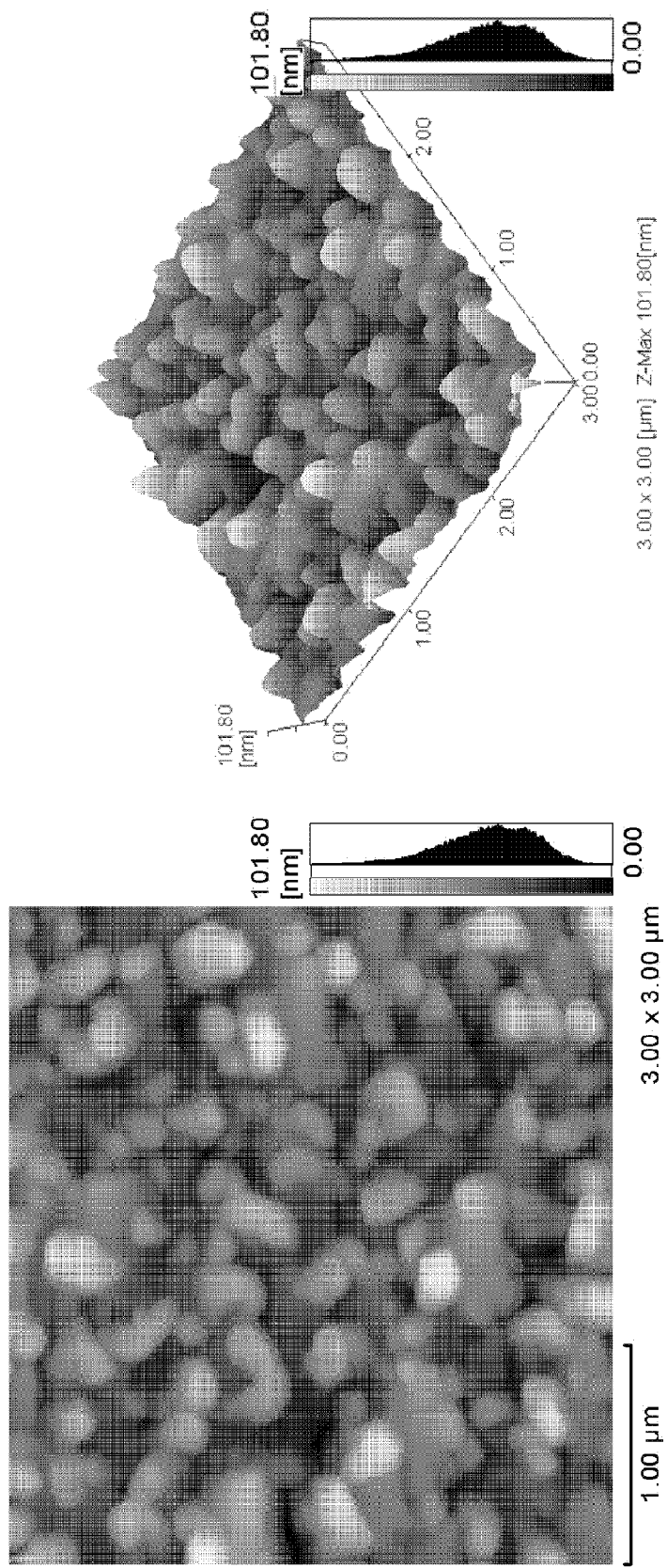
FIG. 3 shows a lamination example of a pentacene film and an $SiO_x$ film.

FIG. 3 shows an AFM image of a thin-film laminate obtained by depositing an $SiO_x$ film (thickness: about 5 Å) instead of the $Al_2O_3$ film.

In this case, the surface roughness was 15.8 nm. Specifically, the effect of the inorganic material on the surface roughness was observed.

Example 4

Figure 4:
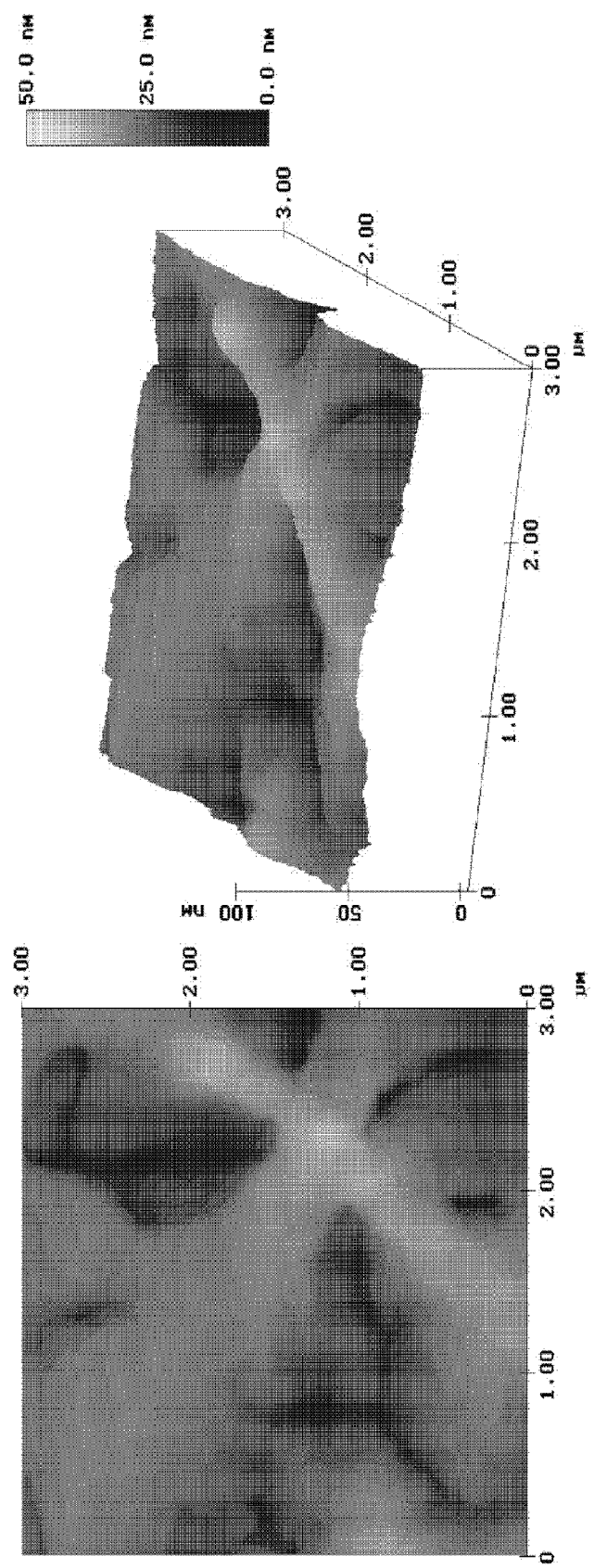
FIG. 4 shows a lamination example of a pentacene film (100 Å) and an $Al_2O_3$ film (10 Å).

FIG. 4 shows an AFM image of a thin-film laminate obtained by depositing a pentacene film (thickness: about 100 Å) and an $Al_2O_3$ film (thickness: about 10 Å) three times, and forming a pentacene film (thickness: 100 Å) on the resulting laminate.

In this case, the surface roughness was 3.9 nm.

Comparative Example 1

Figure 5:
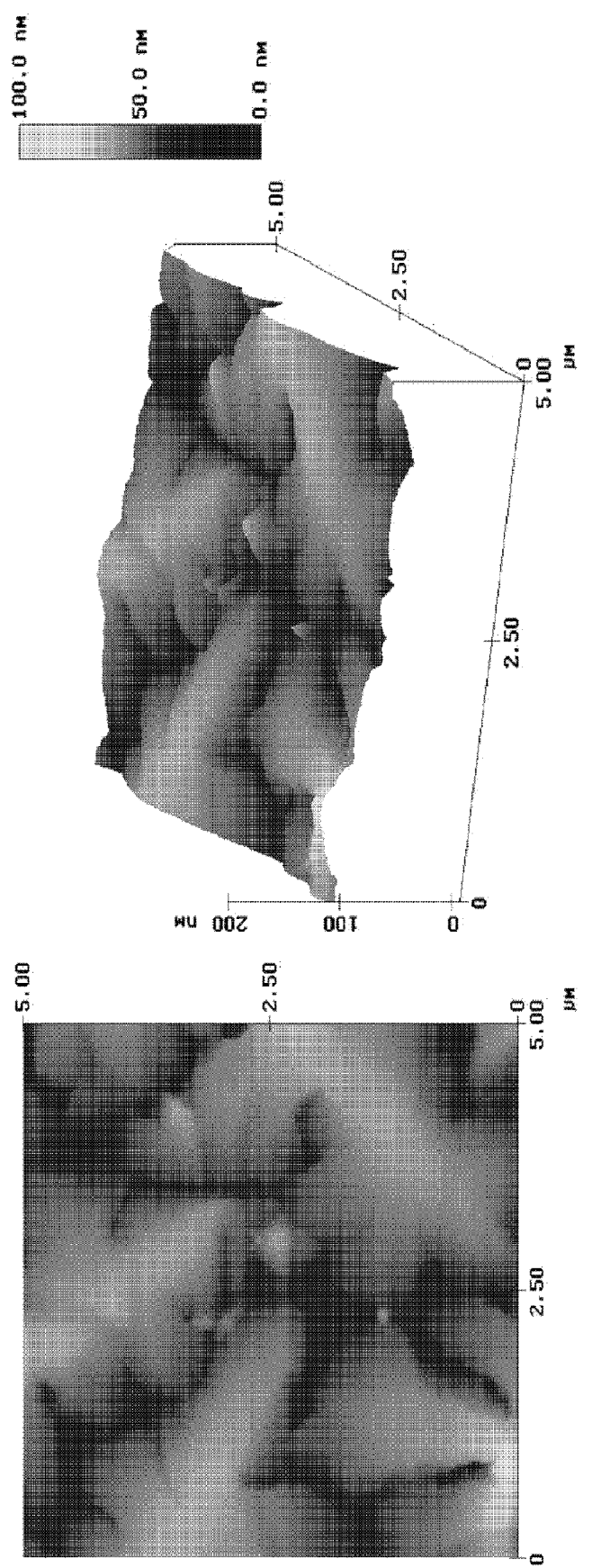
FIG. 5 shows an AFM image of a pentacene film (400 Å).
Figure 6:
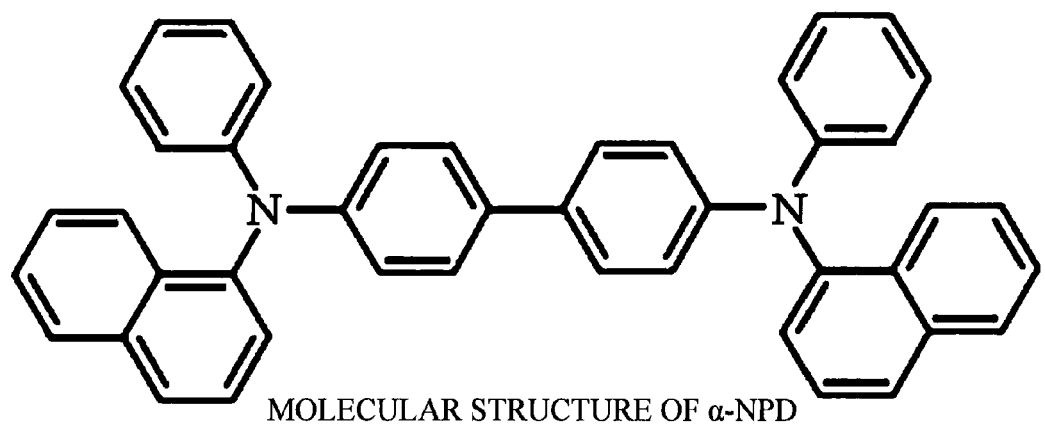
FIG. 6 shows the molecular structure of α-NPD.

FIG. 5 shows an AFM image of a sample obtained by depositing only pentacene to a thickness of 400 Å.

The sample had a surface roughness of 6.7 nm, and had a dendritic structure.

Example 1 is compared with Comparative Example 1. The sample of Comparative Example 1 obtained by depositing only pentacene to a thickness of 400 Å had a dendritic film structure. In the laminate of Example 1 obtained by stacking pentacene and the $Al_2O_3$ layer (5 Å) the pentacene thin film had a uniform superlattice structure. Moreover, the laminate had a surface roughness of 2 nm (i.e. very flat).

It is important that the surface roughness be 5 nm or less when applying the laminate structure according to one aspect of the invention to the organic semiconductor substrate of the organic transistor according to another aspect of the invention.

The pentacene thin film was prevented from having a three-dimensional structure by merely reducing the thickness of the pentacene thin film to 100 Å or less (see Example 4). The thickness of the pentacene thin film may be reduced to 50 Å or less corresponding to the application, for example.

Since the superlattice structure and the surface roughness value are affected by the thickness of the inorganic insulating thin film, the thickness of one layer may be reduced to 5 Å or less when flatness is desired.

Since the thin-film laminate according to one aspect of the present invention is a semiconductor film formed of an organic material that has an amorphous structure, but has a uniform superlattice structure, the thin-film laminate is expected to have various effects such as a reduction in resistance, a change in activation energy, resonant tunneling, an increase in mobility of a transistor, or an increase in photoluminescence intensity.

Example 5

The organic transistor according to another aspect of the invention was produced using the laminate structure according to one aspect of the invention, and evaluated.

Figure 7:
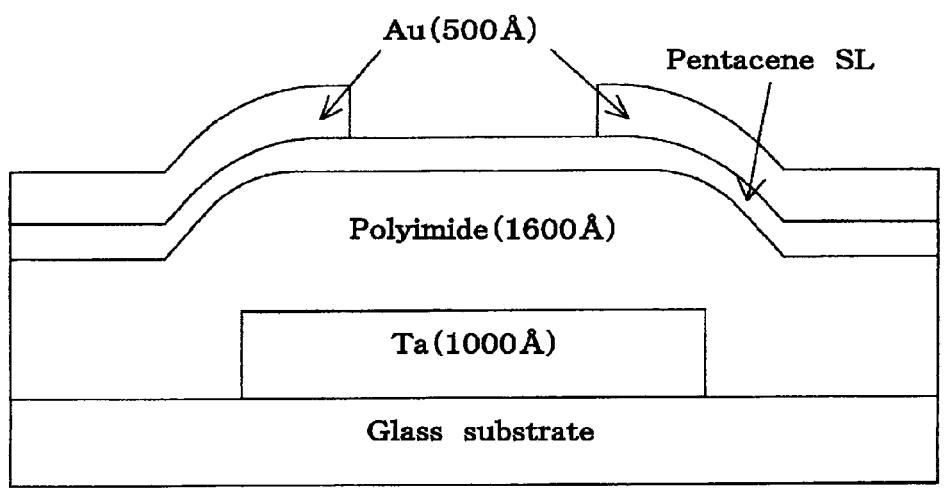
FIG. 7 shows an example of the structure of an organic transistor that was produced and evaluated.

A top contact structure shown in FIG. 7 was used as the structure of the organic transistor.

A [pentacene (bilayer (2ML))/α-NPD (31 Å)]×n (n=0 to 4)/pentacene (2ML) structure was formed on a Ta gate electrode/polyimide insulating film (1600 Å, "CT4112" manufactured by KYOCERA Chemical Corporation), and an Au electrode was formed as a source/drain to obtain a top contact OSLTFT.

The channel length was 0.5 to 2 mm, and the channel width was 2 mm.

A device (organic transistor) including a pentacene film having a thickness of 40 nm was produced as a comparative example. A device 1 had a bilayer (2ML) pentacene structure, a device 2 had a pentacene (2ML)/α-NPD (31 Å)/pentacene (2ML) structure, a device 3 had a pentacene (2ML)/α-NPD (31 Å)/pentacene (2ML)/α-NPD (31 Å)/pentacene (2ML) structure, a device 4 had a pentacene (2ML)/α-NPD (31 Å)/pentacene (2ML)/α-NPD (31 Å)/pentacene (2ML)/α-NPD (31 Å) structure and a device 5 had a pentacene (2ML)/α-NPD (31 Å)/pentacene (2ML)/α-NPD (31 Å)/pentacene (2ML)/α-NPD (31 Å)/pentacene (2ML) structure. These devices were evaluated.

FIGS. 8 to 12 show the characteristics of the resulting transistors.

Figure 8:
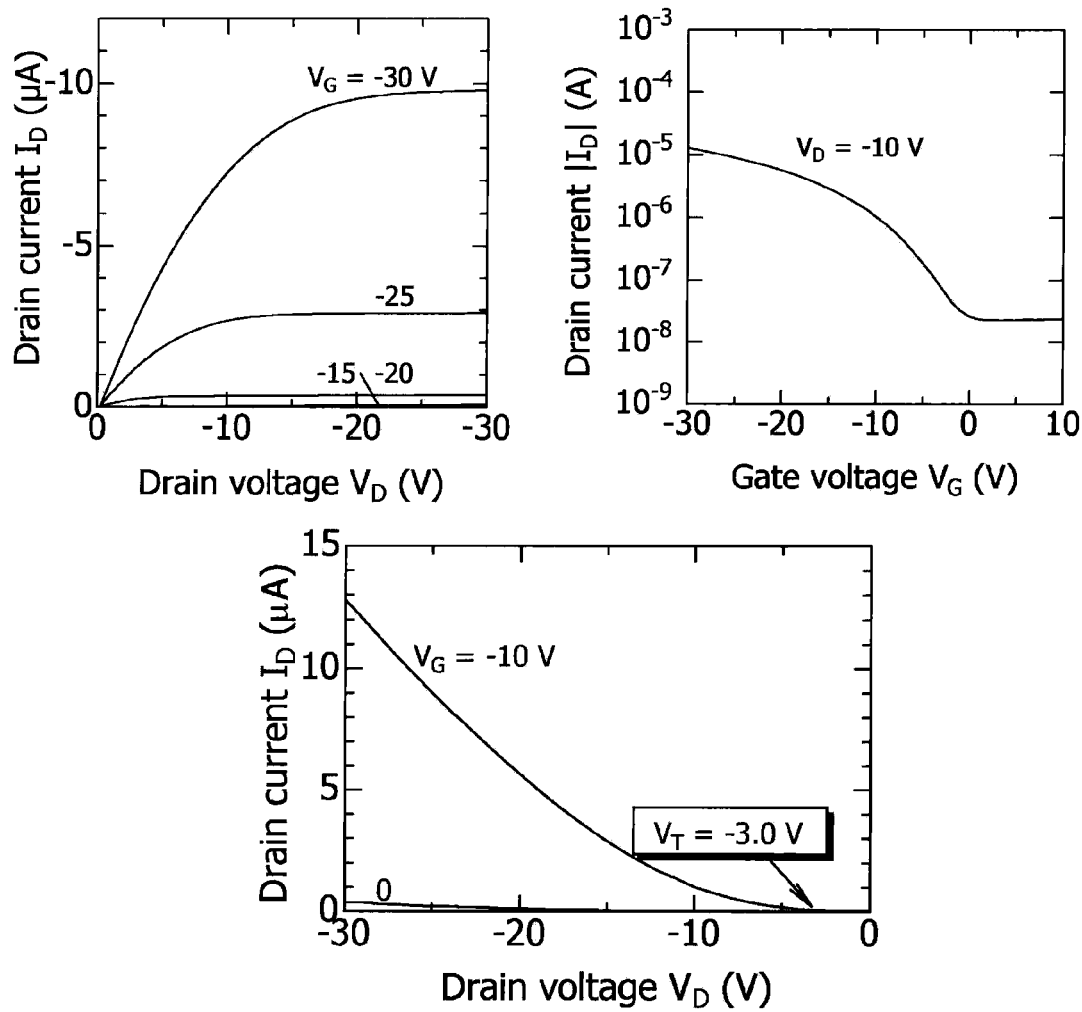
FIG. 8 shows the transistor characteristics of a device 1.
Figure 9:
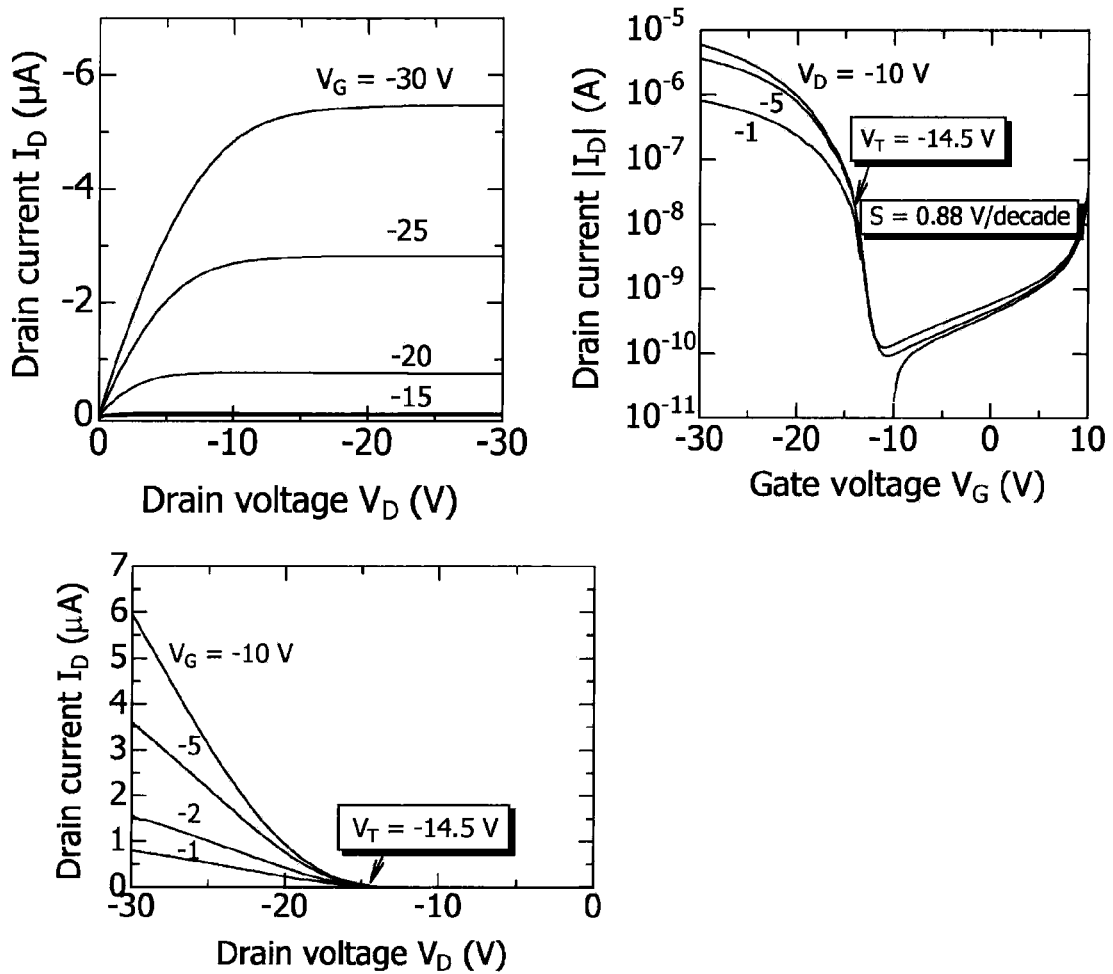
FIG. 9 shows the transistor characteristics of a device 2.
Figure 10:
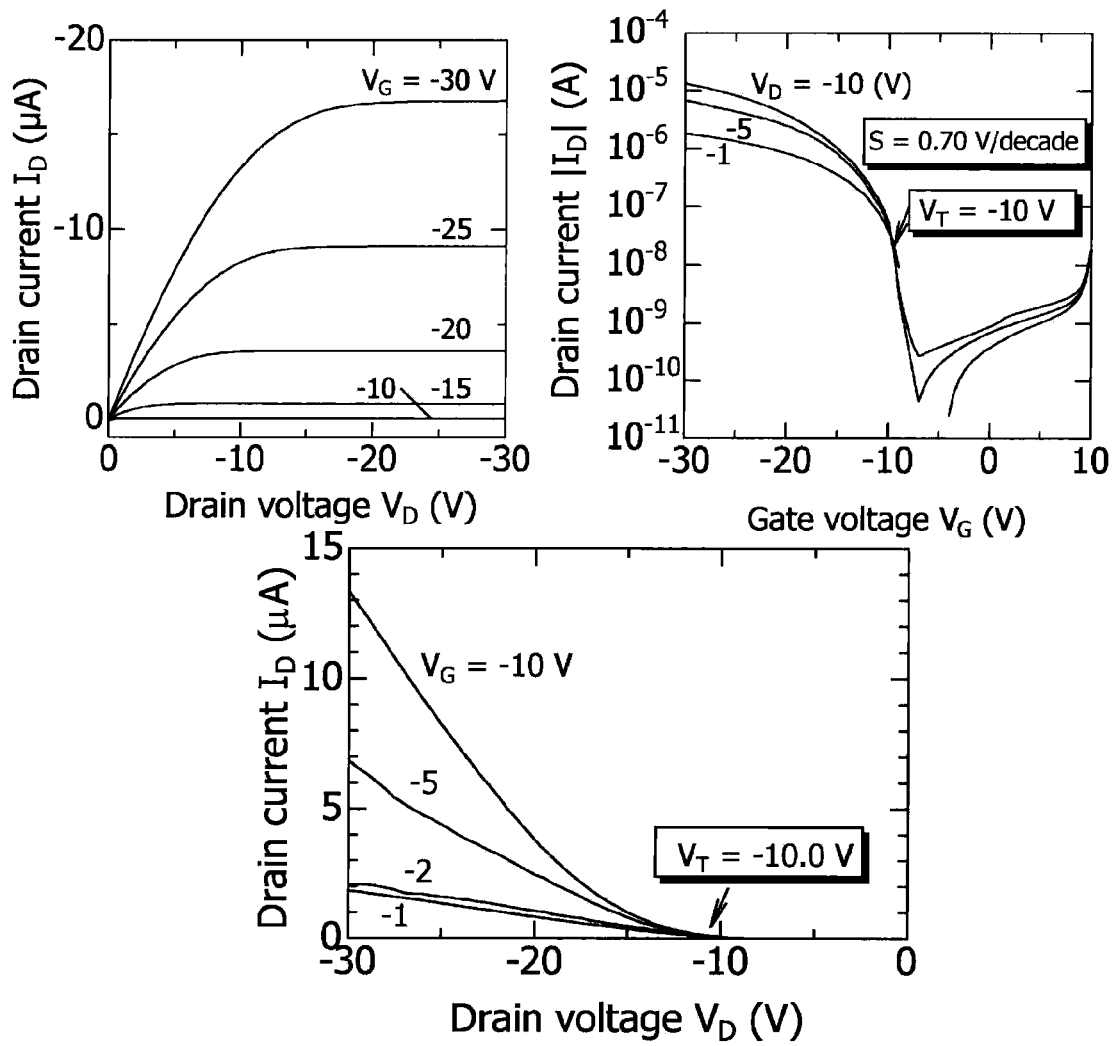
FIG. 10 shows the transistor characteristics of a device 3.
Figure 11:
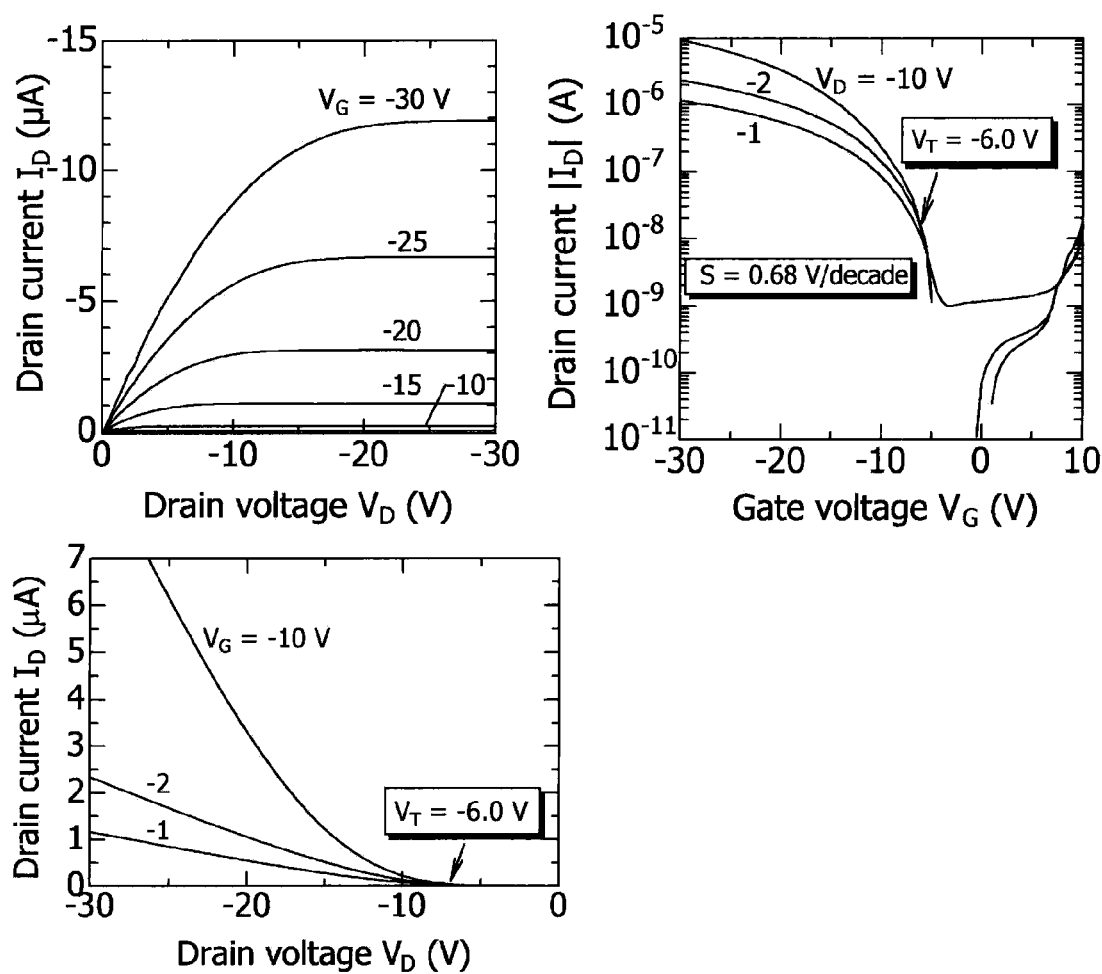
FIG. 11 shows the transistor characteristics of a device 4.

FIG. 8 shows the transistor characteristics when using the pentacene film having a thickness of 40 nm (comparative example). The device 1 did not operate. FIG. 9 shows the transistor characteristics of the device 2. FIG. 10 shows the transistor characteristics of the device 3. FIG. 11 shows the transistor characteristics of the device 4, FIG. 12 shows the transistor characteristics of the device 5.

Figures 12, 13:
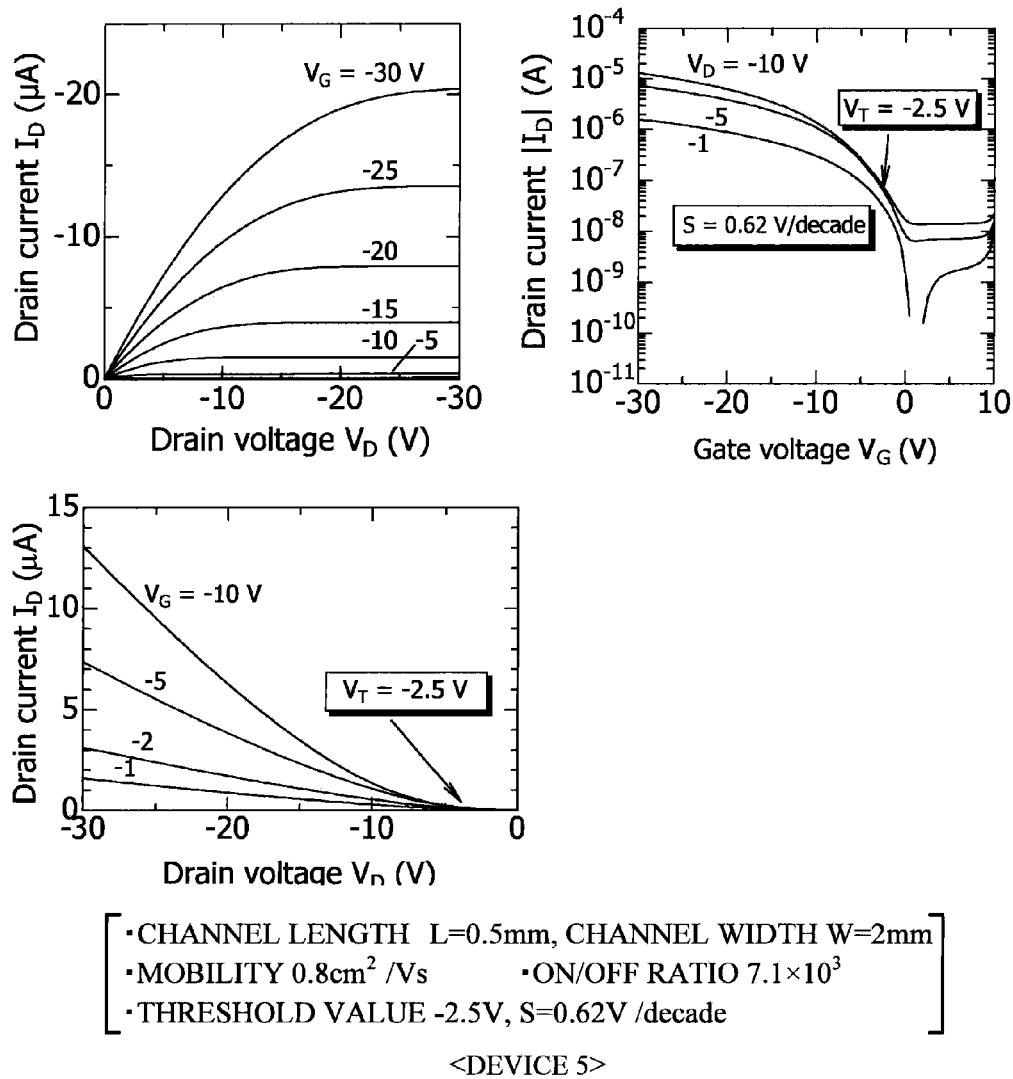
FIG. 12 shows the transistor characteristics of a device 5.
FIG. 13 shows a comparison table of the transistor characteristics of the devices 1 to 5.

FIG. 13 summarizes the characteristic values obtained from the transistor characteristics.

The transistor of the device 1 did not operate. The devices 2 and 3 had a mobility of 1.35 $cm^2$/Vs and 1.25 $cm^2$/Vs, a threshold voltage of −14.5 V and −10.0 V, an ON/OFF ratio of $4.6 \times 10^4$ and $10^6$, and an ON-resistance of 1.35 MΩ and 0.56 MΩ, respectively.

A high mobility that exceeds a normal pentacene transistor (comparative example) was obtained by the devices 2 and 3. The device 3 had the highest ON/OFF ratio.

The threshold value of the organic transistor changed by changing the number of layers. Specifically, the threshold value could thus be controlled.

The thin-film laminate according to one aspect of the present invention can be utilized for flexible organic display panels. RFID drivers, optical sensor and optical scanner drivers, composite integrated circuits, and the like.

What is claimed is:

1. An organic transistor comprising:
   a gate;
   a gate insulation layer;
   a semiconductor section that includes a first organic thin film and a second organic thin film that are alternately stacked;
   a drain electrode that is connected to a drain of the semiconductor section; and
   a source electrode that is connected to a source of the semiconductor section,
   the semiconductor section including at least a three layer structure having the second organic thin film sandwiched directly between two layers of the first organic thin film, the first organic thin film being a pentacene thin film, and the second organic thin film being an amorphous organic thin film.

2. The organic transistor as defined in claim 1, the pentacene thin film being a pentacene bilayer thin film, and the amorphous organic thin film being a tetraaryldiamine thin film.

3. The organic transistor as defined in claim 2, the tetraaryldiamine thin film being an α-NPD thin film.

* * * * *